DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JUNE 30, 1970

875 O.G. 714

T875,030

LITHOGRAPHIC PRINTING PLATE

Thomas I. Abbott and Hugo F. Huedepohl, both
% Kodak Park Works, Rochester, N.Y. 14650

Filed Jan. 26, 1970, Ser. No. 5,564
**Int. Cl. G03f *7/06;* G03c *11/12***
U.S. Cl. 96—33
1 Sheet Drawing. 11 Pages Specification

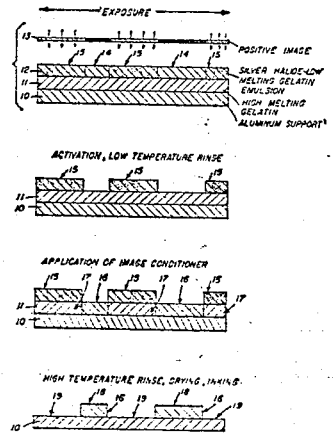

An autopositive lithographic printing plate is provided comprising a silver halide-low melting gelatin emulsion e.g. having a melting point of from about 60° F. to about 110° F. containing a tanning developer e.g. a polyhydroxy benzene developer such as 4-phenyl catechol, etc., coated on a layer of higher melting gelatin e.g. having a melting point of about 75° F. to about 125° F., on an aluminum support. The melting point upper layer is advantageously maintained at a value of about 10 to about 15° F. degrees below the melting point of the lower layer. After exposure and activation, the untanned areas of the top layer are washed away and the plate is treated with an image conditioner which reacts with the uncovered areas of the bottom gelatin layer rendering them oleophilic. The remainders of the top layer and the untreated areas of the bottom layer are then washed away with hotter water. The plate is then dried and inked to produce a lithographic plate which is positive with respect to the original.